(12) United States Patent
Kim et al.

(10) Patent No.: US 12,055,825 B2
(45) Date of Patent: Aug. 6, 2024

(54) DISPLAY DEVICE

(71) Applicant: Samsung Display Co., LTD., Yongin-si (KR)

(72) Inventors: Eunbyul Kim, Gwangju (KR); Daegeun Lee, Hwaseong-si (KR); Sukho Choi, Seongnam-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 169 days.

(21) Appl. No.: 17/226,880

(22) Filed: Apr. 9, 2021

(65) Prior Publication Data

US 2022/0005915 A1 Jan. 6, 2022

(30) Foreign Application Priority Data

Jul. 1, 2020 (KR) .................. 10-2020-0080989

(51) Int. Cl.
*G02F 1/1345* (2006.01)
*G02F 1/1333* (2006.01)
*H05K 1/18* (2006.01)
*H10K 59/131* (2023.01)
*H10K 59/88* (2023.01)

(52) U.S. Cl.
CPC .... *G02F 1/13452* (2013.01); *G02F 1/133308* (2013.01); *G02F 1/1345* (2013.01); *G02F 1/13454* (2013.01); *H05K 1/189* (2013.01); *H10K 59/131* (2023.02); *H10K 59/88* (2023.02)

(58) Field of Classification Search
CPC ... G02F 1/1345; G02F 1/13452–13458; G02F 1/133308
See application file for complete search history.

(56) References Cited

U.S. PATENT DOCUMENTS

| | | | |
|---|---|---|---|
| 10,506,718 B2 | 12/2019 | Zhao et al. | |
| 10,651,260 B2* | 5/2020 | Lee | ..................... H01L 27/3258 |
| 2016/0218289 A1 | 7/2016 | Lee et al. | |
| 2019/0229174 A1* | 7/2019 | Choi | ................... H01L 27/3223 |
| 2020/0357871 A1 | 11/2020 | Chung et al. | |

FOREIGN PATENT DOCUMENTS

| | | |
|---|---|---|
| CN | 107683020 | 2/2018 |
| JP | 2005-209894 | 8/2005 |
| KR | 10-2016-0091526 | 8/2016 |
| KR | 10-2019-0021525 | 3/2019 |
| KR | 10-2020-0039866 | 4/2020 |

\* cited by examiner

*Primary Examiner* — Dung T Nguyen
(74) *Attorney, Agent, or Firm* — KILE PARK REED & HOUTTEMAN PLLC

(57) ABSTRACT

A display device includes a display panel including a plurality of display pads, a portion of the plurality of display pads being extended along a first direction and arranged along a second direction intersecting the first direction, and a flexible circuit board including a plurality of substrate pads electrically connected to the plurality of display pads, and a plurality of dummy pads spaced apart from the plurality of substrate pads and arranged in parallel to the plurality of substrate pads along the second direction, a portion of the plurality of dummy pads have an extension length in the first direction and a width in the second direction substantially same as an extension length in the first direction and a width in the second direction, respectively, of the plurality of substrate pads.

21 Claims, 12 Drawing Sheets

DISPLAY DEVICE

CROSS-REFERENCE TO RELATED APPLICATION(S)

This application claims priority to and benefits of Korean Patent Application No 10-2020-0080989 under 35 U.S.C. § 119, filed on Jul. 1, 2020 in the Korean Intellectual Property Office, the entire contents of which are incorporated herein by reference.

BACKGROUND

(a) Technical Field

The disclosure herein relates to a display device, and, to a display device preventing damage to a display panel and a flexible circuit board generated during a bonding process of the display panel and the flexible circuit board, thereby having improved durability and reliability.

(b) Description of the Related Art

A display device, such as a television, a monitor, a smart phone, and a tablet, providing an image to a user may include a display panel for displaying an image. Various display panels, such as a liquid crystal display panel, an organic light emitting display panel, an electro wetting display panel, and an electrophoretic display panel, are being developed as display panels.

With the recent development of display device technology, a display device including a flexible display panel is being developed. The display panel may include pixels for displaying an image and a driving circuit for driving the pixels. In order to allow the display device to be thinner, the pixels are disposed in a display area of the display panel, and a flexible circuit board on which driving circuits are mounted may be connected to a non-display area of the display panel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device having improved reliability and durability.

The disclosure also provides a display device having improved durability and reliability by preventing damage to a flexible circuit board and a display panel which may be generated during a bonding process of the flexible circuit board and the display panel, while including a flexible base layer.

An embodiment provides a display device that may include a display panel including a plurality of display pads, wherein a portion of the plurality of the display pads may be extended along a first direction and arranged along a second direction intersecting the first direction; and a flexible circuit board including a plurality of substrate pads electrically connected to the plurality of display pads and a plurality of dummy pads spaced apart from the plurality of substrate pads and arranged in parallel to the plurality of substrate pads along the second direction, wherein a portion of the plurality of dummy pads may have an extension length in the first direction and a width in the second direction substantially same as an extension length in the first direction and a width in the second direction, respectively, of the plurality of substrate pads.

In an embodiment, each of the plurality of substrate pads and the plurality of dummy pads may be extended in a diagonal direction between the first direction and the second direction.

In an embodiment, a length of each of the plurality of substrate pads extended in the diagonal direction and a length of each of the plurality of dummy pads extended in the diagonal direction may be substantially same.

In an embodiment, the flexible circuit board may further include an alignment mark overlapping a portion of the plurality of dummy pads in the first direction.

In an embodiment, the alignment mark may be extended along the second direction; and the plurality of dummy pads may include a first dummy pad disposed adjacent to the plurality of substrate pads; and a second dummy pad overlapping the alignment mark in the first direction.

In an embodiment, the plurality of display pads may overlap the plurality of substrate pads in a plan view; and the display panel may further include a panel alignment mark at least partially overlapping the alignment mark in a plan view.

In an embodiment, the flexible circuit board may further include a plurality of resistance test pads disposed between the plurality of substrate pads and the plurality of dummy pads.

In an embodiment, the plurality of resistance test pads may include a first test pad electrically connected to a constant current source; a second test pad electrically connected to a constant voltage source; and a common test pad electrically connected to the constant current source and the constant voltage source.

In an embodiment, the common test pad may be disposed between the first test pad and the second test pad; and the plurality of resistance test pads may further include a dummy test pad disposed between the first test pad and the second test pad.

In an embodiment, a portion of the plurality of dummy pads may be the first test pad or the second test pad.

In an embodiment, the display panel may further include a measurement pad electrically connected to the first test pad, the second test pad, and the common test pad.

In an embodiment, the display device may further include a conductive adhesive film disposed between the display panel and the flexible circuit board and electrically connecting the plurality of display pads to the plurality of substrate pads.

In an embodiment, the flexible circuit board may further include an additional pad extended along the first direction and disposed adjacent to an end of the flexible circuit board.

In an embodiment, the display device may further include a main circuit board electrically connected to the flexible circuit board.

In an embodiment, a display device may include a display panel including a plurality of display pads, wherein a portion of the plurality of display pads may be extended along a first direction and arranged along a second direction intersecting the first direction; and a flexible circuit board including a plurality of substrate pads electrically connected to the plurality of display pads; a plurality of dummy pads spaced apart from the plurality of substrate pads and arranged in parallel to the plurality of substrate pads along the second direction; and a plurality of resistance test pads disposed between the plurality of substrate pads and the plurality of dummy pads, wherein the plurality of resistance test pads may include a first test pad electrically connected to a constant current source; a second test pad electrically connected to a constant voltage source; and a common test pad electrically connected to the constant current source and the constant voltage source.

In an embodiment, a portion of the plurality of dummy pads may be the first test pad or the second test pad.

In an embodiment, the common test pad may be disposed between the first test pad and the second test pad; and the plurality of resistance test pads may further include a dummy test pad disposed between the first test pad and the second test pad.

In an embodiment, each of the plurality of substrate pads, the plurality of resistance test pads, and the plurality of dummy pads may be inclined at an angle between the first direction and the second direction.

In an embodiment, the flexible circuit board may further include an alignment mark overlapping at least a portion of the plurality of dummy pads in the first direction; and the display panel may further include a panel alignment mark at least partially overlapping the alignment mark in a plan view.

In an embodiment, a display device may include a display panel including a plurality of display pads extended along a first direction and arranged along a second direction intersecting the first direction; and a flexible circuit board that may include a plurality of substrate pads electrically connected to the plurality of display pads; and a plurality of resistance test pads arranged in parallel to the plurality of substrate pads along the second direction, wherein the plurality of resistance test pads may include a first test pad electrically connected to a constant current source; a second test pad electrically connected to a constant voltage source; a common test pad electrically connected to the constant current source and the constant voltage source; and a dummy test pad disposed between the first test pad and the second test pad, and wherein the common test pad may be disposed between the first test pad and the second test pad.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1:
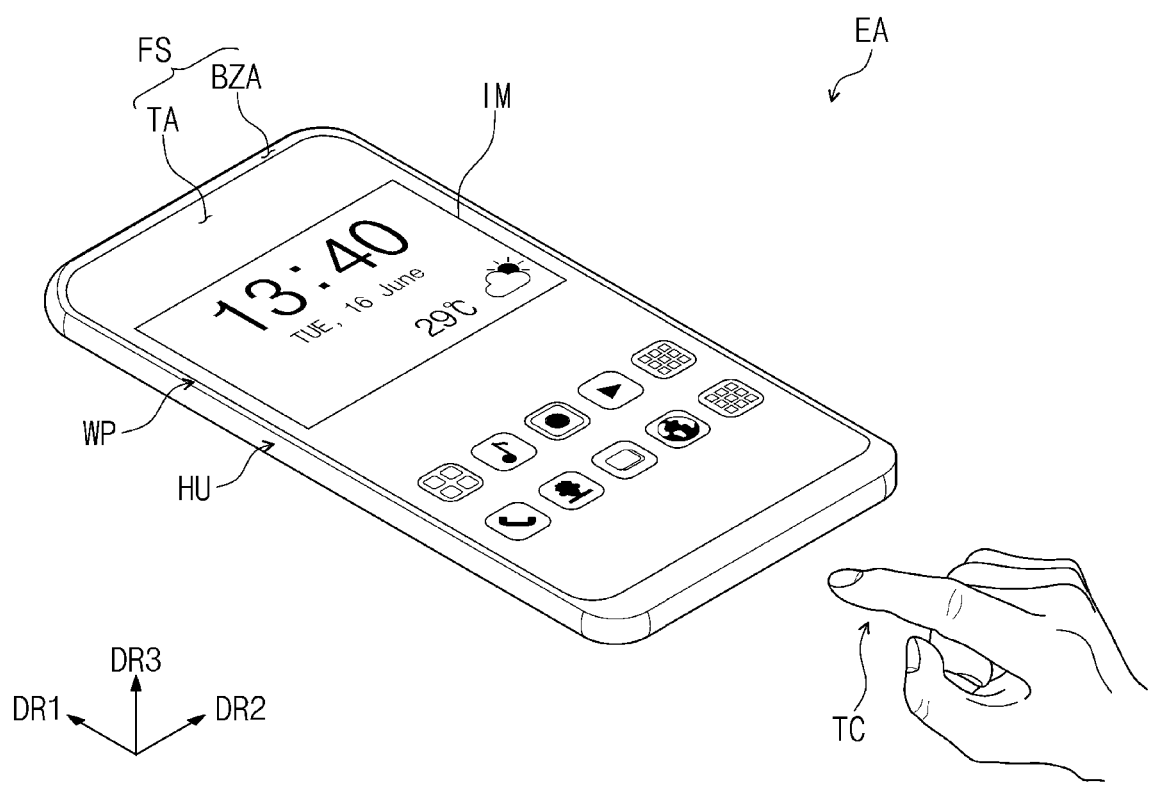
FIG. 1 is an assembled perspective view of a display device according to an embodiment.

Hereinafter, embodiments will be described with reference to the accompanying drawings. In the disclosure, when an element (or an area, a layer, a portion, etc.) is referred to as being "on," "connected to," or "coupled to" another element, it means that the element may be directly connected to/coupled to the other element, or that a third element may be disposed therebetween.

Like reference numerals refer to like elements. Also, in the drawings, the thickness, the ratio, and the dimensions of elements are exaggerated for an effective description of technical contents and/or for clarity. The term "and/or," includes all combinations of one or more of which associated configurations may define.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

As used herein, the singular forms "a," "an," and "the" are intended to include the plural forms as well, unless the context clearly indicates otherwise.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments o. The terms of a singular form may include plural forms unless the context clearly indicates otherwise.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

As used herein, the term "unit" and/or "module" denotes a structure or element as illustrated in the drawings and as described in the specification. However, the disclosure is not limited thereto. The term "unit" and/or "module" is not to be limited to that which is illustrated in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

In addition, terms such as "below," "lower," "above," "upper," and the like are used to describe the relationship of the configurations shown in the drawings but are not limited thereto. The terms are used as a relative concept and are described with reference to the direction indicated in the drawings but are not limited thereto.

It should be understood that the terms "comprise", "comprises", or "comprising" or "have" or "has" or "include", "includes", or "including" and their variations are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, a display device according to an embodiment will be described with reference to the accompanying drawings.

Figure 2:
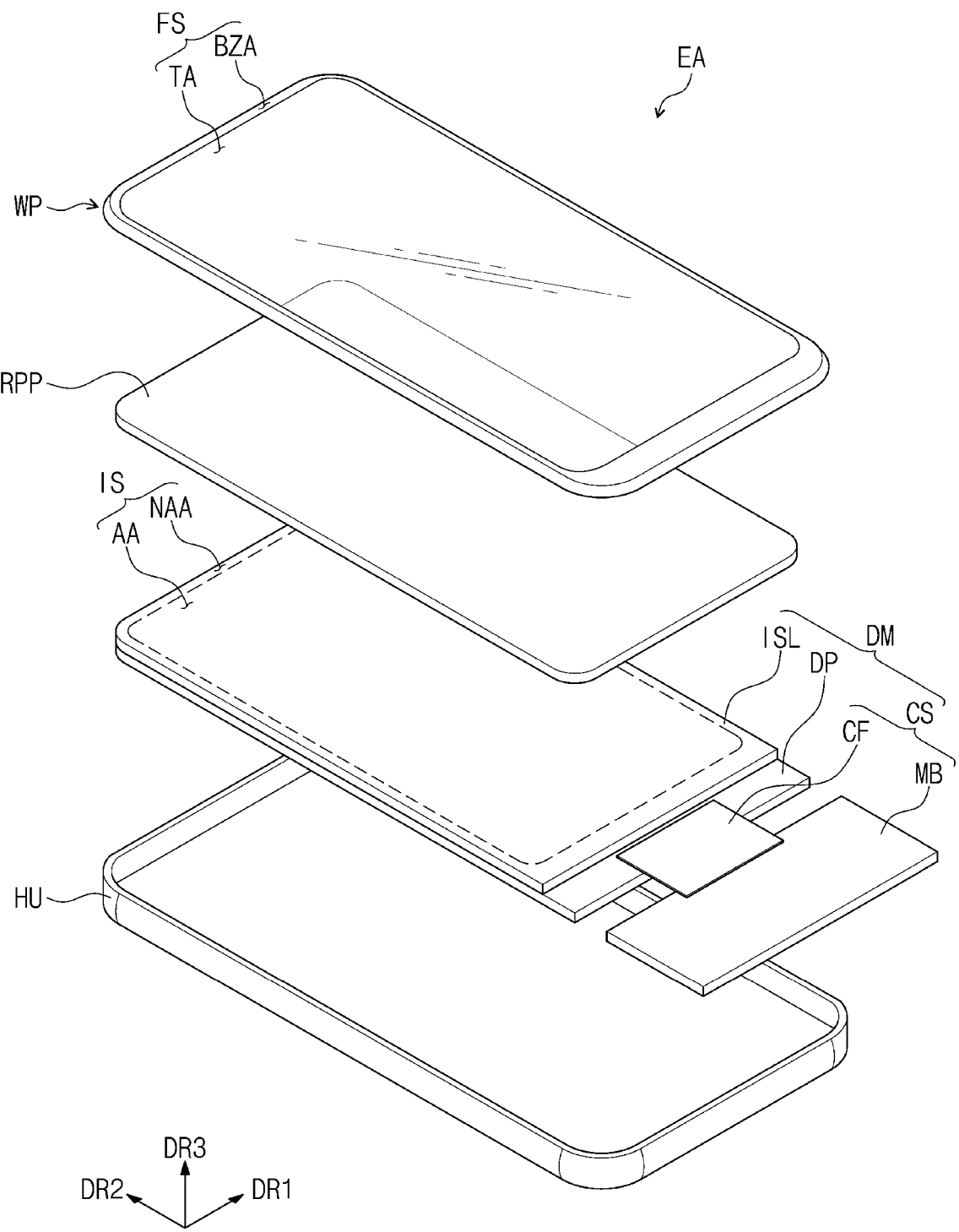
FIG. 2 is an exploded perspective view of a display device according to an embodiment.

FIG. 1 is an assembled perspective view of a display device according to an embodiment. FIG. 2 is an exploded perspective view of a display device according to an embodiment.

Referring to FIGS. 1 and 2, a display device EA may be a device activated by an electrical signal. The display device EA may include various embodiments. For example, the display device EA may be used in large electronic devices such as televisions, monitors, or external advertisement boards, as well as in small and medium electronic devices such as personal computers, laptop computers, personal digital terminals, vehicle navigation system units, game consoles, portable electronic apparatuses, and cameras. It should be understood that these devices are merely embodiments and the display device EA may be employed in other electronic devices without departing from the spirit and scope of the disclosure. In an embodiment, the display device EA may be illustrated as being, for example, a smart phone.

The display device EA may display an image IM toward a third direction DR3 on a display surface FS parallel to each of a first direction DR1 and a second direction DR2. The image IM may include a moving image and a still image. In FIG. 1, as an example of the image IM, a watch window and icons may be illustrated. The display surface FS on which the image IM is displayed may correspond to a front surface of the display device EA, and may correspond to a front surface of a window panel WP.

In an embodiment, a front surface (or an upper surface) and a back surface (or a lower surface) of each member may be defined or formed on the basis of a direction in which the image IM may be displayed. The front surface and the back surface may oppose each other in a third direction DR3 and the normal direction of each of the front surface and the back surface may be parallel to the third direction DR3. Directions indicated by the first to third directions DR1, DR2, and DR3 may be relative concepts and may be converted to different directions. In the disclosure, "on a plane" may mean "when viewed in the third direction DR3".

The display device EA may include the window panel WP, a reflection prevention panel RPP, a display module DM, and a housing HU. In an embodiment, the window panel WP and the housing HU may be coupled or connected to form the appearance of the display device EA.

The window panel WP may include an optically transparent insulation material. For example, the window panel WP may include glass or plastic. The window panel WP may have a multi-layered or single-layered structure. For example, the window panel WP may include plastic films bonded to each other with an adhesive, or a glass substrate and a plastic film bonded to each other with an adhesive therebetween.

The front surface of the window panel WP may define or form the front surface of the display device EA. A transmission area TA may be an optically transparent area. For example, the transmission area TA may be an area having a visible light transmittance of about 90% or higher.

A bezel area BZA may be an area having a relatively lower light transmittance than the transmission area TA. The bezel area BZA may define or form the shape of the transmission area TA. The bezel area BZA may be adjacent to the transmission area TA and may surround the transmission area TA.

The bezel area BZA may have a predetermined color. The bezel area BZA may cover or overlap a peripheral area NAA of the display module DM to block the peripheral area NAA from being viewed from the outside. The bezel area BZA is only an example, and the bezel area BZA may be omitted from the window panel WP according to an embodiment.

The reflection prevention panel RPP may be disposed below the window panel WP. The reflection prevention panel RPP may reduce the reflectance of external light incident from an upper side of the window panel WP. In an embodiment, the reflection prevention panel RPP may be omitted, or may be a component included in the display module DM.

The display module DM may display the image IM and sense an external input TC. The external input TC may include various forms of inputs provided from the outside of the display module DM. The external input TC applied from the outside may be provided in various forms.

For example, the external input TC may include not only a contact by a part of a user's body such as a hand, but also an external input (for example, hovering) applied in close proximity, or adjacent to the display module DM at a predetermined distance. Also, the external input may have various forms such as force, pressure, and light, but is not limited to any one embodiment. FIG. 1 shows the user's hand as an example of the external input TC.

The display module DM may include an entire surface IS including an active area AA and the peripheral area NAA. The active area AA may be an area activated by an electrical signal.

In an embodiment, the active area AA may be an area in which the image IM is displayed, and at the same time, may be an area in which the external input TC is sensed. The transmission area TA may overlap at least the active area AA. For example, the transmission area TA may overlap a front surface or at least a portion of the active area AA. Accordingly, the user may view the image IM through the transmission area TA, or may provide an external input. However, the active area AA is only an example. In the active area AA, an area in which the image IM is displayed and an area in which the external input TC is sensed may be separated from each other, but an embodiment is not limited to any one embodiment.

The peripheral area NAA may be an area covered or overlapped by the bezel area BZA. The peripheral area NAA may be adjacent to the active area AA. The peripheral area NAA may surround or may be adjacent to the active area AA. The peripheral area NAA may have a driving circuit or a driving line for driving the active area.

The display module DM may include the display panel DP, an input sensing unit ISL, and a circuit board CS.

The display panel DP may be a component which may substantially generate the image IM. The image IM generated by the display panel DP may be viewed to the user from the outside through the transmission area TA.

The input sensing unit ISL may sense an external input TC applied from the outside. As described above, the input sensing unit ISL may sense an external input TC provided to the window panel WP.

The circuit board CS may be electrically connected to the display panel DP. The circuit board CS may include a main circuit board MB and a flexible circuit board CF.

The flexible circuit board CF may be electrically connected to the display panel DP. The flexible circuit board CF may electrically connect the display panel DP and the main circuit board MB. In an embodiment, the flexible circuit board CF may be illustrated as a flexible circuit film having the main circuit board MB electrically connected at an end thereof. However, the flexible circuit board CF is only an example. The flexible circuit board CF may not be electrically connected to the main circuit board MB.

The flexible circuit board CF may be electrically connected to pads (for example, display pads) of the display panel DP disposed in the peripheral area NAA. The flexible circuit board CF may provide an electrical signal for driving the display panel DP to the display panel DP. The electrical signal may be generated in the flexible circuit board CF or the main circuit board MB.

Although not illustrated, the circuit board CS may include an input circuit board which may be electrically connected to the input sensing unit ISL. The input circuit board may electrically connect the input sensing unit ISL and the main circuit board MB. In an embodiment, the input circuit board may be provided as a flexible circuit film to electrically connect the input sensing unit ISL and the main circuit board MB. However, the circuit board CS is not limited thereto and may not be electrically connected to the main circuit board MB.

The input circuit board may be electrically connected to pads (for example, sensing pads) of the input sensing unit ISL disposed in the peripheral area NAA. The input circuit board may provide an electrical signal for driving the input sensing unit ISL to the input sensing unit ISL. The electrical signal may be generated in the input circuit board or the main circuit board MB.

The main circuit board MB may include various driving circuits for driving the display module DM or connectors for supplying power. Each of the flexible circuit board CF and the input circuit board may be electrically connected to the main circuit board MB. According to the disclosure, the display module DM may be controlled through a single main circuit board MB. However, the main circuit board MB is an example. In the display module DM according to an embodiment, the display panel DP and the input sensing unit ISL may be electrically connected to different main circuit boards MB, and any one of the flexible circuit board CF and the input circuit board may not be electrically connected to the main circuit board MB. However, the display module DM is not limited thereto.

The housing HU may be coupled to the window panel WP. The housing HU may be coupled to the window panel WP to provide a predetermined internal space. The display module DM may be accommodated in the internal space.

The housing HU may include a material having relatively high rigidity. For example, the housing HU may include glass, plastic, or a metal, or may include frames and/or plates composed of combinations thereof. The housing HU may protect the components of the display device EA accommodated in the internal space from an external impact.

Figure 3A:
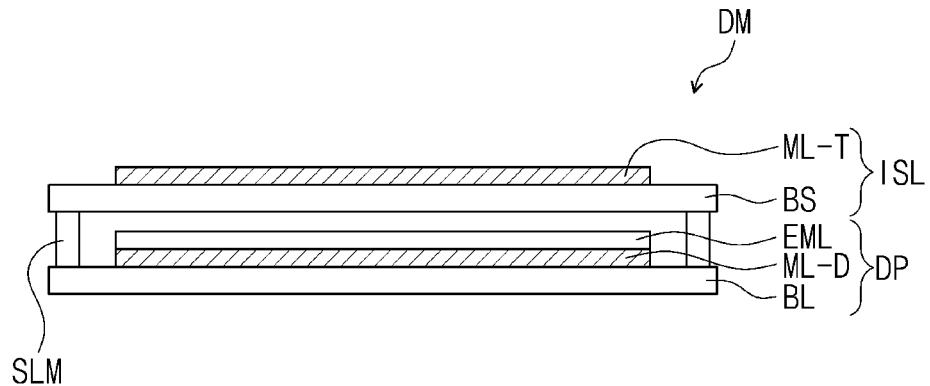
FIG. 3A and FIG. 3B are schematic cross-sectional views of display devices according to embodiments.
Figure 3A:
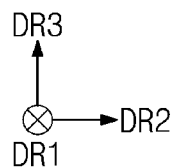

FIG. 3A is a schematic cross-sectional view of a display device according to an embodiment.

Referring to FIG. 3A, a display module DM may include a display panel DP, an input sensing unit ISL, and a coupling member SLM.

The display panel DP according to an embodiment may be a light emitting type display panel, but is not particularly limited thereto. For example, the display panel DP may be an organic light emitting display panel or a quantum dot light emitting display panel.

The display panel DP may include a base substrate BL, a display circuit layer ML-D, and an emission layer EML. The input sensing unit ISL may include an upper substrate BS and a sensing circuit layer ML-T.

Each of the base substrate BL and the upper substrate BS may be a silicon substrate, a plastic substrate, a glass substrate, an insulation film, or a laminated structure including insulation layers. The base substrate BL may be a display substrate on which a circuit layer, a display layer, and the like may be disposed.

The display circuit layer ML-D may be disposed on the base substrate BL. The display circuit layer ML-D may include insulation layers, conductive layers, and a semiconductor layer. The conductive layers of the display circuit layer ML-D may constitute a control circuit for signal lines or pixels.

The emission layer EML may be disposed on the display circuit layer ML-D. The emission layer EML may be a layer for generating light or controlling the transmittance of light. For example, the emission layer EML of an organic light emitting display panel may include an organic light emitting material. The emission layer EML of a quantum dot light emitting display panel may include at least one of a quantum dot or a quantum load. The emission layer EML of a liquid crystal display panel may include a liquid crystal layer.

The upper substrate BS may be disposed on the emission layer EML. The upper substrate BS may be an encapsulation substrate for encapsulating the display panel DP. The upper substrate BS and the emission layer EML may have a predetermined space defined or formed therebetween. The space defined or formed between the upper substrate BS and the emission layer EML may be filled with air or an inert gas. For example, in an embodiment, the space defined or formed between the upper substrate BS and the emission layer EML may be filled with a filler such as a silicone-based polymer, an epoxy-based resin, or an acrylic resin. However, the emission layer EML and the upper substrate BS are not limited thereto. The emission layer EML and the upper substrate BS may have no space therebetween and may be in contact with each other.

The sensing circuit layer ML-T may be disposed on the upper substrate BS. The sensing circuit layer ML-T may include insulation layers and conductive layers. The conductive layers may constitute a sensing electrode sensing an external input TC, a sensing line electrically connected to the sensing electrode, and a sensing pad electrically connected to the sensing line.

The base substrate BL and the upper substrate BS may have the coupling member SLM therebetween. The coupling member SLM may couple or connect the base substrate BL and the upper substrate BS. The coupling member SLM may include an organic material such as a photo-curable resin or a photo-plastic resin, or an inorganic material such as a frit seal, but the coupling member SLM is not limited to any one embodiment.

Figure 3B:
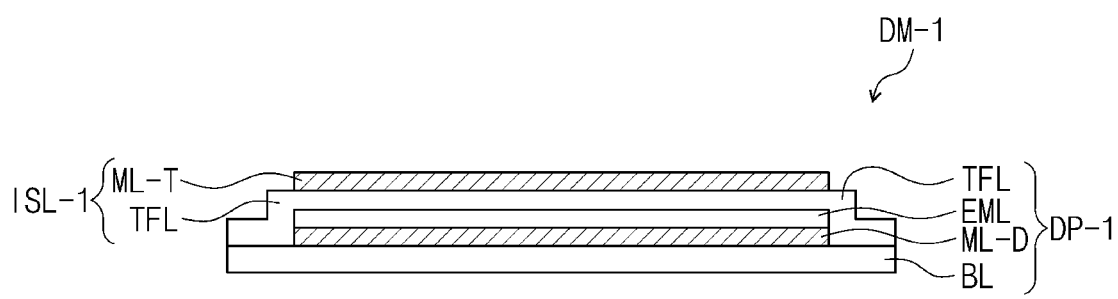
Figure 3B:
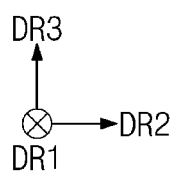

FIG. 3B is a schematic cross-sectional view of a display device according to an embodiment.

Referring to FIG. 3B, a display module DM-1 may include a display panel DP-1 and an input sensing unit ISL-1. The input sensing unit ISL-1 may be referred to as an input sensing layer.

The display panel DP-1 may include a base substrate BL, a display circuit layer ML-D, an emission layer EML, and a thin film encapsulation layer TFL. The input sensing unit ISL-1 may include a base layer TFL and a sensing circuit layer ML-T. The thin film encapsulation layer TFL and the base layer TFL may be the same layer.

According to an embodiment, the display panel DP-1 and the input sensing unit ISL-1 may be formed in a series of processes. For example, the sensing circuit layer ML-T may be disposed on the thin film encapsulation layer TFL.

Figure 4:
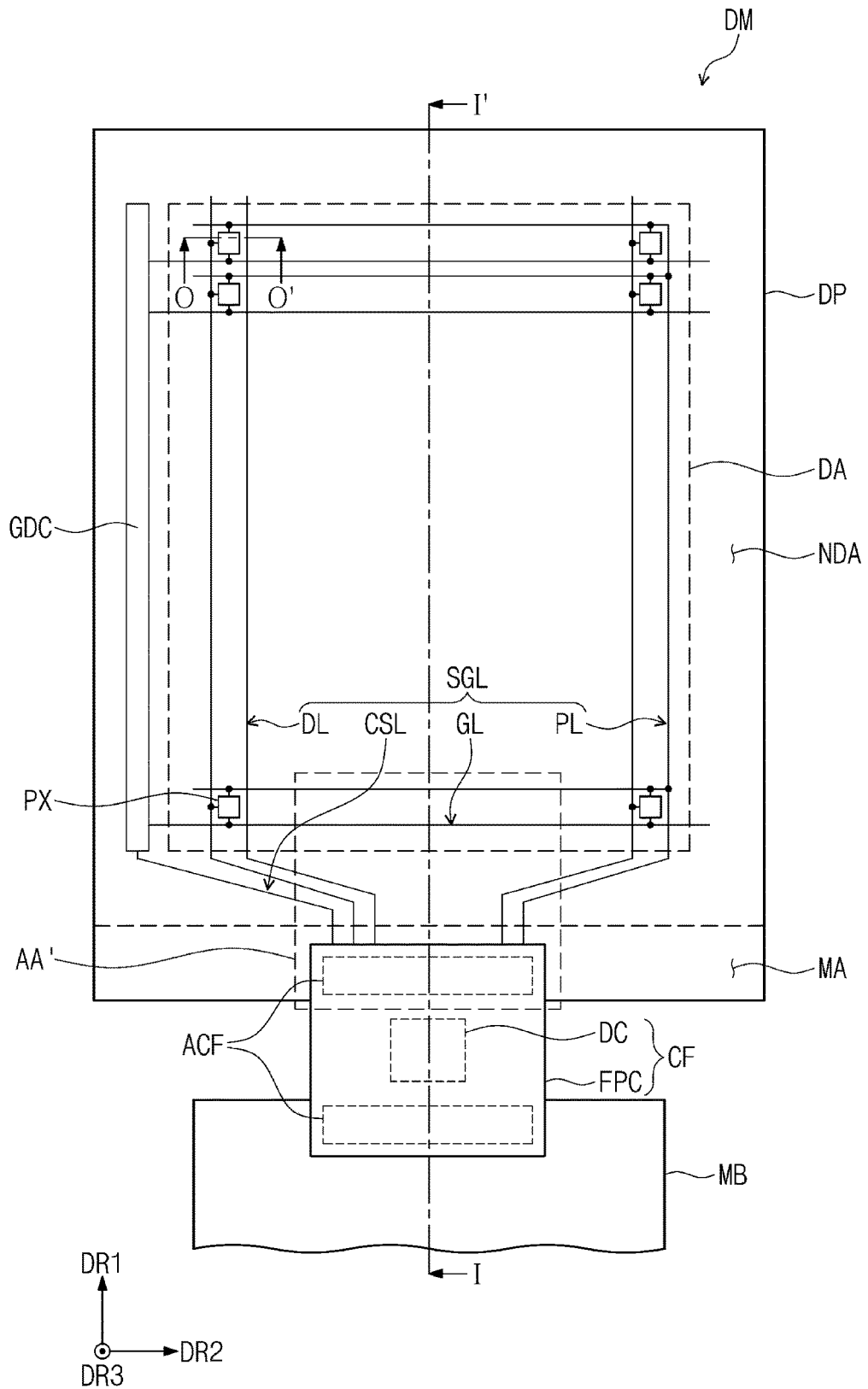
FIG. 4 is a plan view of a display device according to an embodiment.
Figure 5A:
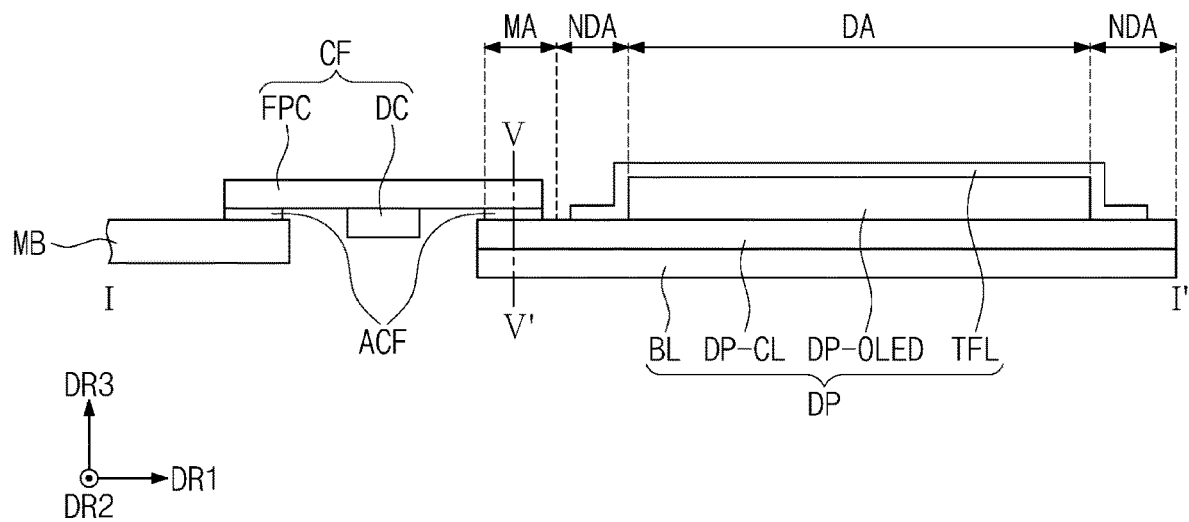
FIG. 5A is a schematic cross-sectional view of a display device according to an embodiment.

FIG. 4 is a plan view of a display device according to an embodiment. FIG. 5A is a schematic cross-sectional view of a display device according to an embodiment. FIG. 5A is a schematic cross-sectional view of a surface taken along line I-I' of FIG. 4.

Referring to FIGS. 4 and 5A, the display module DM according to an embodiment may include a display panel DP, a flexible circuit board CF, and a conductive adhesive film ACF. The display module DM may include a main circuit board MB electrically connected thereto through the flexible circuit board CF and the conductive adhesive film ACF. In an embodiment, the flexible circuit board CF may include a flexible printed circuit board FPC and a data driving circuit DC.

The display panel DP may have a display area DA in which pixels PX may be disposed and a non-display area NDA adjacent to or surrounding the display area DA, and the display area DA and the non-display area NDA may be defined or formed in the display panel DP. The non-display area NDA may have a pad area PA (see FIG. 6) in which a pad electrode to be described later may be disposed and which may be defined or formed therein. In an embodiment, the display panel DP may have a mounting area MA defined or formed therein. In the mounting area MA, the flexible circuit board CF may be coupled or connected thereto by the conductive adhesive film ACF. The non-display area NDA and the mounting area MA may not be distinguished. The mounting area MA may be a portion of the non-display area NDA. The pad area PA may be defined or formed in a portion of the mounting area MA. The pad area PA will be described in detail later.

As illustrated in FIG. 4, the display panel DP may display a desired image by applying a driving signal to the pixels PX. The pixels PX may be arranged or disposed in a matrix in a first direction DR1 and a second direction DR2. In an embodiment, the pixels PX may include first to third pixels respectively displaying a red (R) color, a green (G) color, and a blue (B) color. In an embodiment, the pixels PX may further include some or a predetermined number of the pixels displaying white, cyan, and magenta.

Each of the pixels PX may include an organic light emitting diode and a driving circuit GDC electrically connected thereto. The driving circuit GDC and signal lines SGL may be included in a circuit element layer DP-CL illustrated in FIG. 5A.

The driving circuit GDC may include a scan driving circuit. The scan driving circuit may generate scan signals and sequentially output the scan signals to scan lines GL (hereinafter, scan lines) to be described later. The scan driving circuit may output another control signal to the driving circuit GDC of the pixels PX.

The scan driving circuit may include thin film transistors formed through the same process as that for forming the driving circuit GDC of the pixels PX, for example, a low temperature polycrystalline silicon (LTPS) process or a low temperature polycrystalline oxide (LTPO) process.

The signal lines SGL may include the scan lines GL, data lines DL, a power line PL, and a control signal line CSL. Each of the scan lines GL may be electrically connected to a corresponding pixel PX among the pixels PX, and each of the data lines DL may be electrically connected to a corresponding pixel PX among the pixels PX. The power line PL may be electrically connected to the pixels PX. The control signal line CSL may provide control signals to the scan driving circuit.

The signal lines SGL may overlap the display area DA and the non-display area NDA. The signal lines SGL may include a pad unit and a line unit. The line unit may overlap the display area DA and the non-display area NDA. The pad unit may be electrically connected to an end of the line unit. The pad unit may be disposed in the non-display area NDA and may overlap a corresponding signal pad among signal pads. Of the non-display area NDA, an area in which the signal pads may be disposed may be defined or formed as the pad area PA (see FIG. 6). The pad area PA will be described in detail below.

According to the type of the pixels PX, the display panel DP may be classified into a liquid crystal display panel, an organic electroluminescent display panel, an electrowetting display panel, a quantum dot light emitting display panel, and the like within the spirit and the scope of the disclosure. In an embodiment, the display panel DP may be an organic electroluminescent display panel.

As illustrated in FIG. 5A, the display panel DP may include a base substrate BL, a circuit element layer DP-CL disposed on the base substrate BL, a display element layer DP-OLED, and a thin film encapsulation layer TFL. As used herein, the sentence "an area and a portion correspond to an area and a portion" means "the area and the portion overlap each other," but is not limited to having the same area and/or the same shape unless otherwise stated.

The base substrate BL may include at least one synthetic resin film. The base substrate BL may include a glass substrate, a metal substrate, an organic or inorganic composite material substrate, and the like within the spirit and the scope of the disclosure.

The circuit element layer DP-CL may include at least one insulation layer and a circuit element. The insulation layer may include at least one inorganic layer and at least one organic layer. The circuit element may include signal lines, a pixel driving circuit, and the like within the spirit and scope of the disclosure.

The display element layer DP-OLED may include at least organic light emitting diodes as light emitting elements. The display element layer DP-OLED may further include an organic layer such as a pixel definition film.

The thin film encapsulation layer TFL may include thin films. Some or a predetermined number of the thin films may increase optical efficiency, and some or a predetermined number of the thin films may protect the organic light emitting diodes.

In the non-display area NDA, a black matrix (not shown) for blocking light may be disposed. In the non-display area NDA, the driving circuit GDC for supplying a gate signal to the pixels PX may be provided or disposed. In an embodiment, a data driving circuit (not shown) may be provided in the non-display area NDA. In the mounting area MA, the pad area PA (see FIG. 6) for receiving a signal supplied from the flexible circuit board CF may be defined or formed.

As illustrated in FIGS. 4 and 5A, the flexible circuit board CF may include the flexible printed circuit board FPC and the data driving circuit DC. The data driving circuit DC may include at least one driving chip. The data driving circuit DC may be electrically connected to lines of the flexible printed circuit board FPC.

In a case that the flexible circuit board CF may include the data driving circuit DC, the pad unit of the display panel DP may include data pads electrically connected to data lines and control signal pads electrically connected to control signal lines. The data lines may be electrically connected to the pixels PX, and the control signal lines may be electrically connected to the driving circuit GDC. In an embodiment, the flexible circuit board CF may be illustrated as having a chip on film structure, but is not limited thereto.

The main circuit board MB may provide image data, a control signal, a power voltage, and the like to the display panel DP or the data driving circuit DC. The main circuit board MB may be a circuit board larger than the flexible printed circuit board FPC and may include active and passive elements. The main circuit board MB may be a flexible or rigid circuit board and may include the pad unit (not shown) electrically connected to the flexible printed circuit board FPC.

Figure 5B:
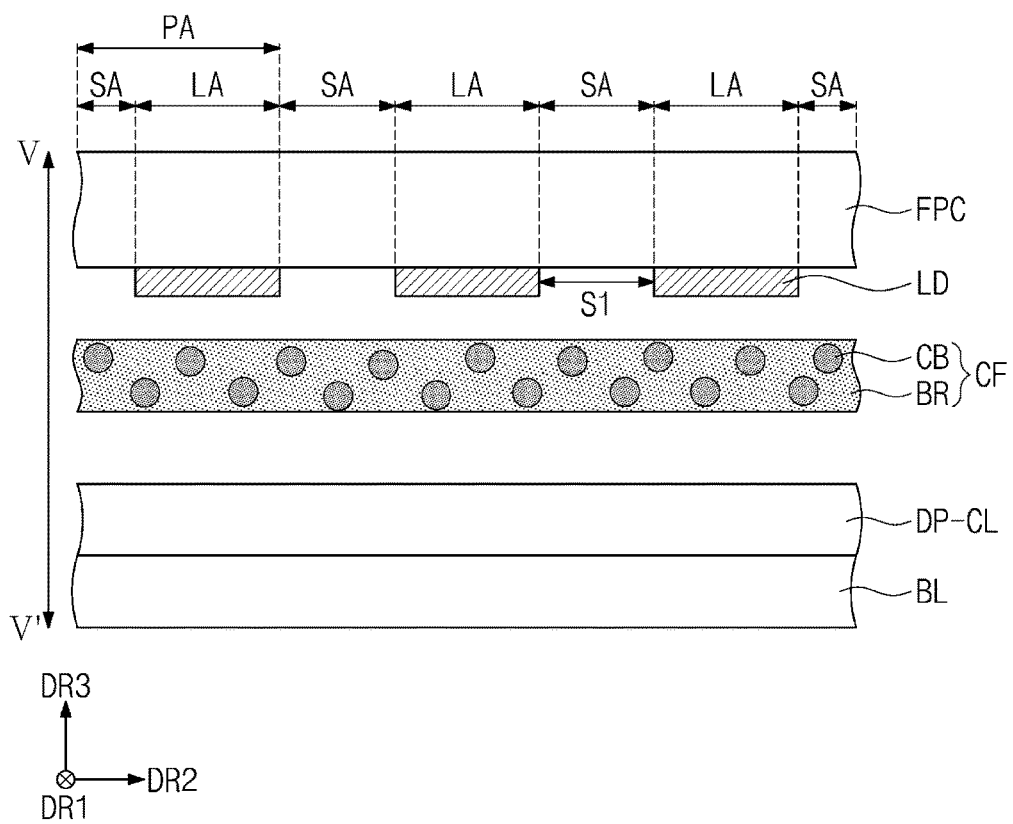
FIG. 5B is a schematic cross-sectional view of a portion of a display device according to an embodiment.

FIG. 5B is a schematic cross-sectional view of a portion of a display device according to an embodiment. FIG. 5B is a schematic exploded cross-sectional view of a surface taken along line V-V' of FIG. 5A.

Referring to FIGS. 5A and 5B, the flexible circuit board CF may include substrate pads LD. In an embodiment, the substrate pads LD may be disposed on the flexible printed circuit board FPC. Each of the substrate pads LD may be spaced apart from each other at a first interval s1. The flexible printed circuit board FPC may correspond to a component which may provide a base surface of the flexible circuit board CF disposed on the display panel DP. The substrate pads LD may come in direct contact with the pad area PA (see FIG. 6) of the display panel DP. For example, the substrate pads LD may be attached on the circuit element layer DP-CL of the display panel DP. The pad area PA may include a first region LA and a second region SA. The substrate pads LD may be overlapped with planar areas of the first region LA, and the first interval s1 between the substrate pads LD may be overlapped with planar areas of the second region SA. The substrate pads LD may come in contact with display pads SD (see FIG. 6) of the circuit element layer DP-CL. The substrate pads LD may electrically connect the flexible circuit board CF and the display panel DP.

The conductive adhesive film ACF may be disposed between the flexible circuit board CF and the display panel DP. The conductive adhesive film ACF may be disposed between the flexible circuit board CF and the circuit element layer DP-CL in the pad area PA. The conductive adhesive film ACF may include conductive balls CB which may electrically connect the flexible circuit board CF and the display panel DP. The conductive adhesive film ACF may include an adhesive resin BR in which the conductive balls CB may be dispersed. The conductive balls CB may be aligned in the second direction DR2 in a case that the display panel DP and the flexible circuit board CF may be electrically connected.

Figure 5C:
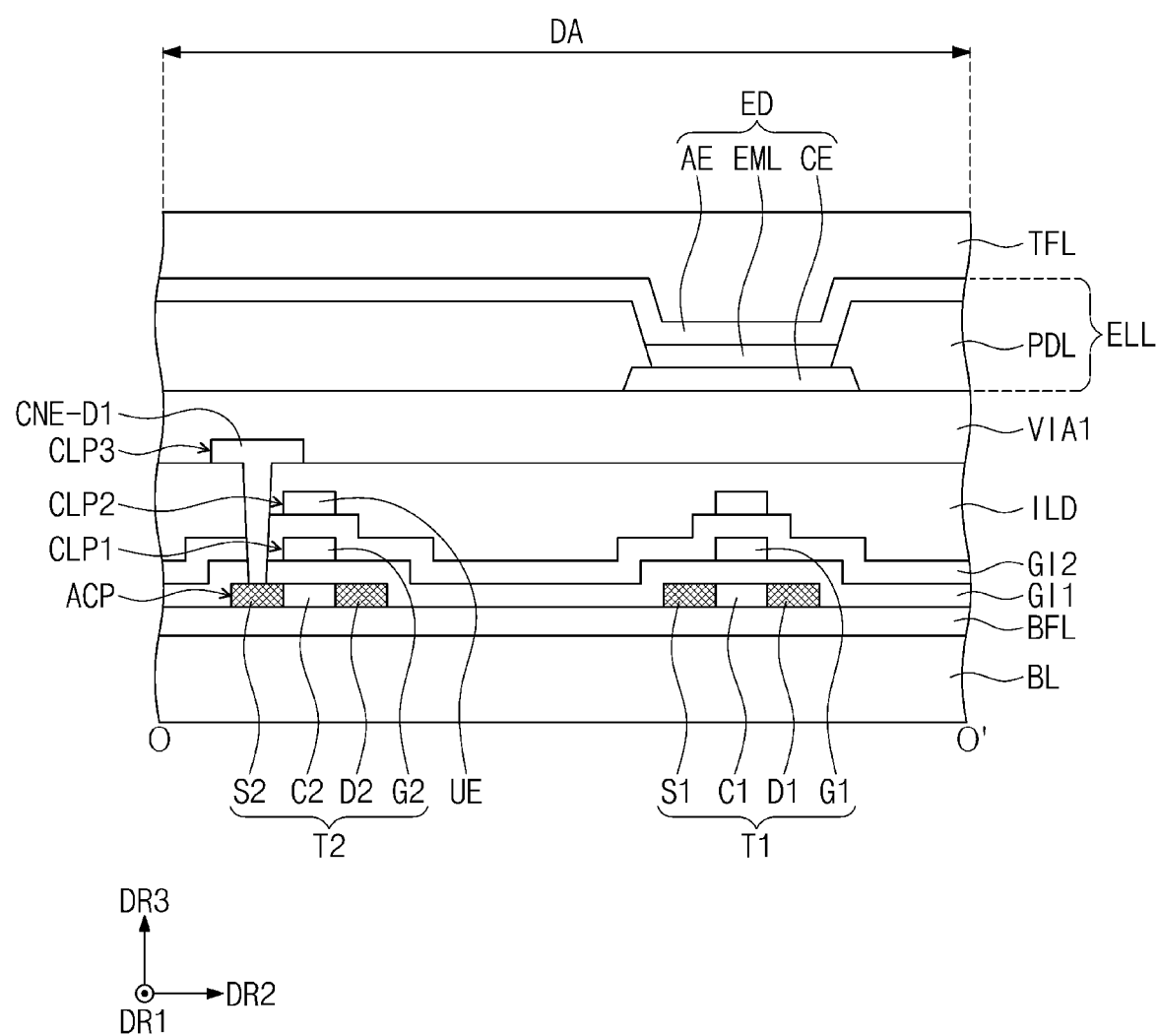
FIG. 5C is a schematic cross-sectional view of a display panel according to an embodiment.

FIG. 5C is a schematic cross-sectional view of a display panel according to an embodiment. FIG. 5C is a schematic cross-sectional view of a surface taken along line O-O' of FIG. 4.

FIG. 5C illustrates a schematic cross-sectional view of the display area DA of the display panel DP. Referring to FIG. 5C, the display panel DP may include a buffer layer BFL, a first gate insulation layer GI1, a second gate insulation layer GI2, an interlayer insulation layer ILD, an upper insulation layer VIA1, a semiconductor pattern ACP having patterns, a first conductive layer CLP1 having patterns, a second conductive layer CLP2 having patterns, and a third conductive layer CLP3 having patterns. The first conductive layer CLP1 may include a first gate metal pattern, the second conductive layer CLP2 may include a second gate metal pattern, and the third conductive layer CLP3 may include a first data metal pattern.

In an embodiment, each of the first gate insulation layer GI1, the second gate insulation layer GI2, and the interlayer insulation layer ILD may include an organic and/or inorganic film. In an embodiment, each of the first gate insulation layer GI1, the second gate insulation layer GI2, and the interlayer insulation layer ILD may include inorganic thin films. The inorganic thin films may include a silicon nitride layer and a silicon oxide layer. In an embodiment, each of the first conductive layer CLP1 and the second conductive layer CLP2 may include molybdenum (Mo), but the first conductive layer CLP1 and the second conductive layer CLP2 are not limited thereto.

In an embodiment, the third conductive layer CLP3 may include at least one of aluminum (Al) or titanium (Ti), but is not limited thereto. In an embodiment, the third conductive layer CLP3 may have a structure in which titanium, aluminum, and titanium layers may be sequentially stacked.

The buffer layer BFL may be disposed on the base substrate BL. The buffer layer BFL may include a first buffer layer and a second buffer layer. The second buffer layer may be disposed on the first buffer layer. The buffer layer BFL may prevent impurities, present in the base substrate BL, from being introduced into the pixel PX, for example, diffused into the semiconductor pattern ACP of transistors T1 and T2 constituting the pixel PX.

Impurities may be introduced from the outside, or may be generated as the base substrate BL is thermally decomposed. Impurities may be a gas or sodium discharged from the base substrate BL. For example, the buffer layer BFL may block moisture introduced into the pixel PX from the outside.

The semiconductor pattern ACP disposed on the buffer layer BFL. In an embodiment, the semiconductor pattern ACP may be disposed on the buffer layer BFL.

The semiconductor pattern ACP may constitute each of the transistors T1 and T2. The semiconductor pattern ACP may include polysilicon, amorphous silicon, or a metal oxide semiconductor. FIG. 5C illustrates a semiconductor pattern ACP constituting a source S1, an active C1, and a drain D1 of a first transistor T1 and a source S2, an active C2, and a drain D2 of a second transistor T2.

The first gate insulation layer GI1 may be disposed on the buffer layer BFL and may cover or overlap the semiconductor pattern ACP. The first conductive layer CLP1 may be disposed on the first gate insulation layer GI1. A gate G1 of the first transistor T1 and a gate G2 of the second transistor T2 are illustrated in the first conductive layer CLP1. Although not illustrated, in an embodiment, the first conductive layer CLP1 may include any one of two electrodes constituting a capacitor of the pixel PX.

The second gate insulation layer GI2 may be disposed on the first gate insulation layer GI1 and may cover or overlap the first conductive layer CLP1. The second conductive layer CLP2 may be disposed on the second gate insulation layer GI2. In an embodiment, the second conductive layer CLP2 may be one of the two electrodes constituting the capacitor of the pixel PX. An upper electrode UE is illustrated as the second conductive layer CLP2.

The interlayer insulation layer ILD may be disposed on the second gate insulation layer GI2 and may cover or overlap the second conductive layer CLP2. First connection electrodes CNE-D1 of the first conductive layer CLP1 may be electrically connected to the gate G1 of the first transistor T1 and the source S2 of the second transistor T2, respectively. The upper insulation layer VIA1 may be disposed on the interlayer insulation layer ILD and may cover or overlap the third conductive layer CLP3.

In FIG. 5C, a light emitting element layer ELL in the display area DA may include a light emitting element ED and a pixel definition film PDL. The light emitting element ED may include an anode electrode AE, an emission layer EML, and a cathode electrode CE.

The cathode electrode CE may be electrically connected to the third conductive layer CLP3 through a contact hole. The pixel definition film PDL may be disposed on the upper insulation layer VIA1 and may expose at least a portion of the cathode electrode CE. The emission layer EML may be disposed on the cathode electrode CE. The anode electrode AE may be disposed on the emission layer EML.

In a case that the light emitting element ED is an organic light emitting diode OLED, the emission layer EML may include an organic material. The thin film encapsulation layer TFL may encapsulate the light emitting element layer ELL to protect the light emitting element layer ELL from external oxygen or moisture. The thin film encapsulation layer TFL may be a layer in which an organic film and an inorganic film may be mixed.

Figure 6:
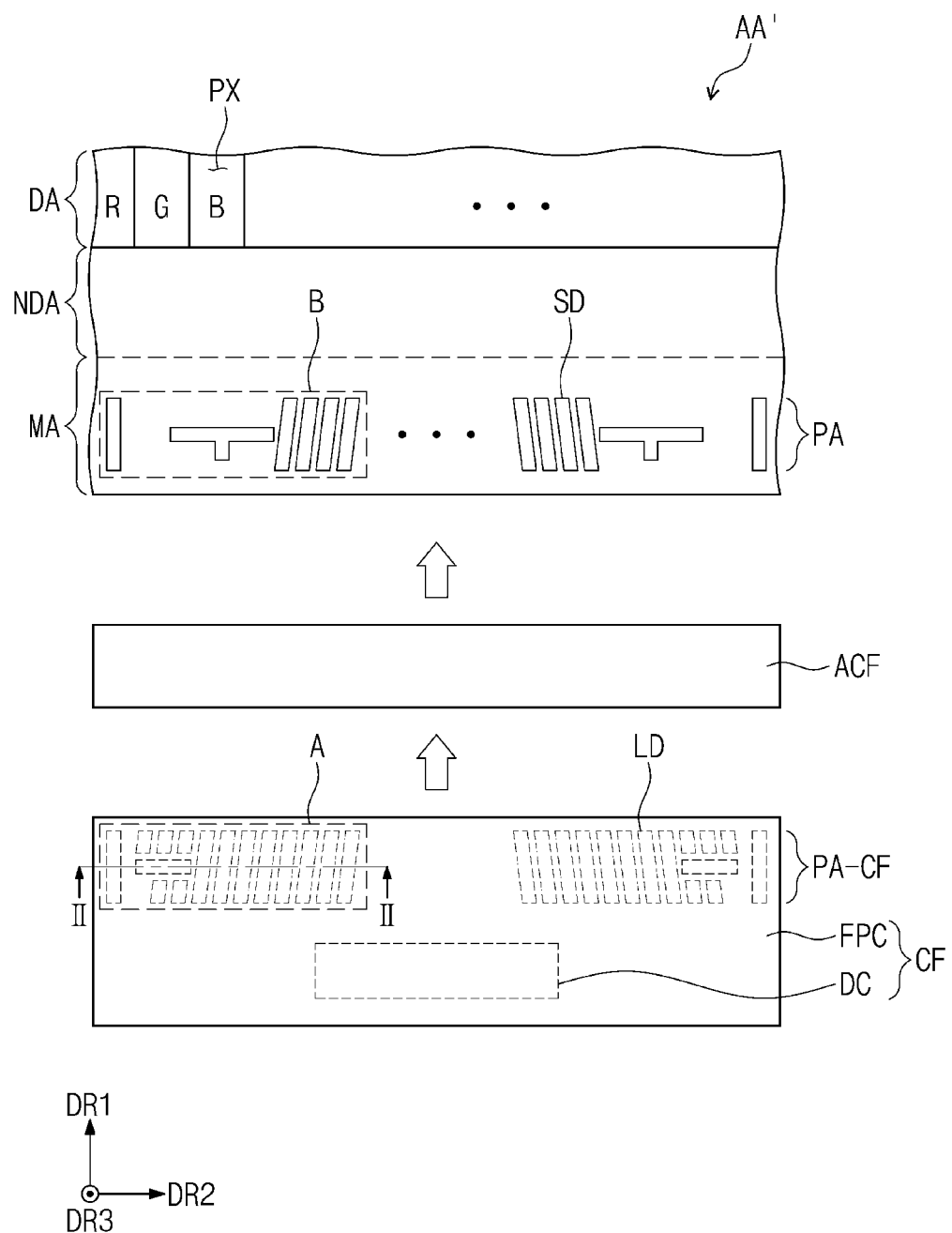
FIG. 6 is a plan view of an area of a display device according to an embodiment.

FIG. 6 is a plan view of an area of a display device according to an embodiment. FIG. 6 is an exploded plan view illustrating a schematic enlarged view of area AA' of FIG. 4.

Referring to FIG. 6, the pad area PA may be defined or formed in the display panel DP. The pad area PA may be defined or formed in a portion of the mounting area MA and may be an area in which the display pads SD may be disposed.

Referring to FIGS. 4 to 6, a substrate pad area PA-CF of the flexible printed circuit board FPC of the flexible circuit board CF and the pad area PA of the display panel DP may be electrically connected by the conductive adhesive film ACF. For example, the pad unit (not shown) of the main circuit board MB may include pads corresponding to the substrate pads LD of the flexible printed circuit board FPC. An input pad unit (not shown) of the flexible printed circuit board FPC and the pad unit (not shown) of the main circuit board MB may be electrically connected by the conductive adhesive film ACF. The conductive adhesive film ACF may be an anisotropic conductive film (ACF). In an embodiment, the conductive adhesive film ACF may be replaced with a shoulder bump. The substrate pads LD disposed in the substrate pad area PA-CF of the flexible printed circuit board FPC may be electrically connected to the display pads SD disposed in the pad area PA of the display panel DP by the conductive adhesive film ACF. The conductive adhesive film ACF may include the conductive balls CB. In a case that the conductive adhesive film ACF is pressed between the flexible printed circuit board FPC and the display panel DP, the conductive balls CB aligned in the first direction DR1 may electrically connect the substrate pads LD of the flexible printed circuit board FPC and the display pads SD of the display panel DP.

Figure 7:
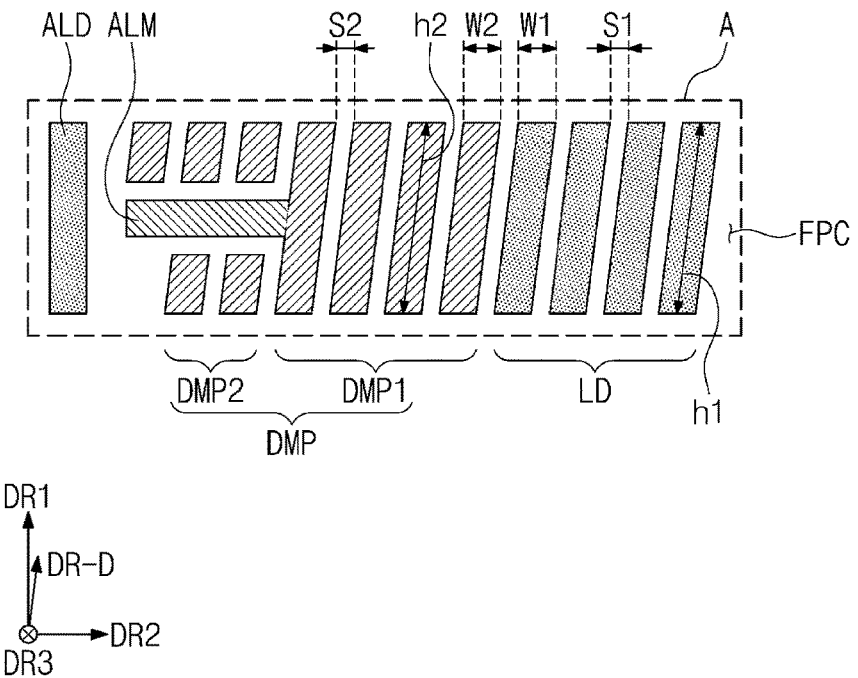
FIG. 7 is a plan view illustrating some enlarged areas of a flexible circuit board according to an embodiment.
Figure 8:
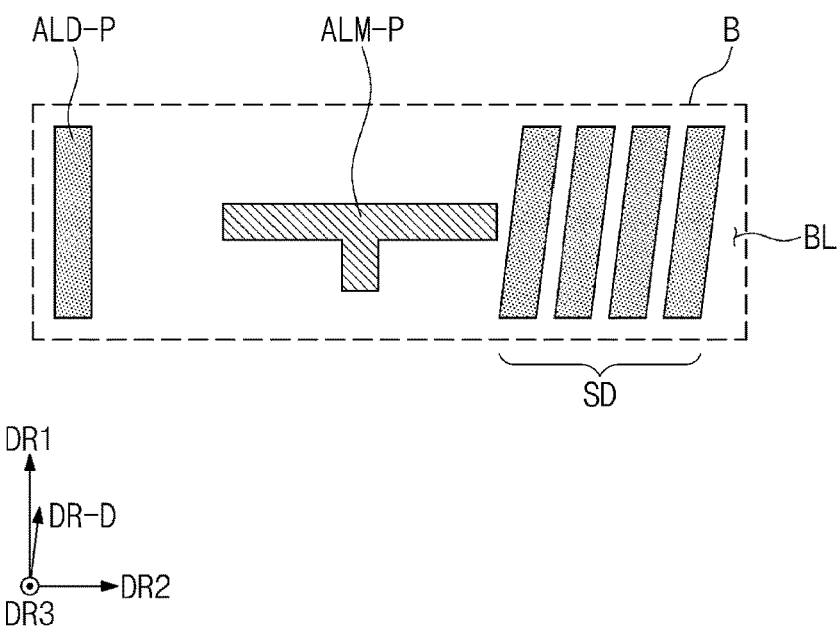
FIG. 8 is a plan view illustrating an enlarged area of a display panel according to an embodiment.
Figure 9:
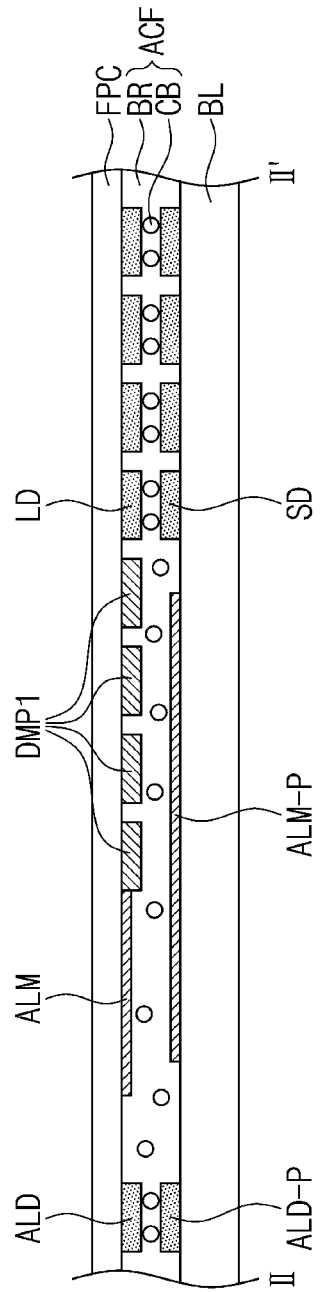
FIG. 9 is a schematic cross-sectional view of an area of a display device according to an embodiment.

FIG. 7 is a plan view illustrating some enlarged areas of a flexible circuit board according to an embodiment. FIG. 8 is a plan view illustrating some enlarged areas of a display panel according to an embodiment. FIG. 9 is a schematic cross-sectional view of an area of a display device according to an embodiment. FIG. 7 illustrates pads of a flexible circuit board corresponding to area A illustrated in FIG. 6. FIG. 8 illustrates pads of a display panel corresponding to area B illustrated in FIG. 6. FIG. 9 illustrates a schematic coupling cross-section of a flexible circuit board and a display panel corresponding to line II-IF illustrated in FIG. 6.

Referring to FIGS. 4, 6, and 7, the flexible circuit board CF according to an embodiment may include the substrate pads LD and a dummy pad DMP arranged or disposed in parallel to the substrate pads LD. The substrate pads LD and the dummy pad DMP may be disposed in the substrate pad area PA-CF. The substrate pads LD and the dummy pad DMP may be disposed on the flexible printed circuit board FPC.

Although not illustrated, a substrate signal line SL-CF (see FIG. 11) electrically connected to the data driving circuit DC may be electrically connected to the substrate pads LD. The substrate pads LD may be electrically connected to the data driving circuit DC included in the flexible circuit board CF through the substrate signal line SL-CF.

The dummy pad DMP may be spaced apart from the substrate pads LD and may be arranged or disposed in parallel to the substrate pads LD in the second direction DR2. The dummy pad DMP may be provided as a plurality of dummy pads DMP, and at least some or a portion of the dummy pads DMP may have substantially the same shape as the substrate pads LD. For example, at least some or a portion of the dummy pads DMP may have substantially the same extension length in the first direction DR1 and substantially the same width in the second direction DR2 as the substrate pads LD.

The flexible circuit board CF may include an alignment mark ALM. The alignment mark ALM may be extended in the second direction DR2 and may be extended from at least some or a portion of the dummy pads DMP. The alignment mark ALM may be used as an identification mark for identifying the position of the flexible circuit board CF or for aligning the flexible circuit board CF and the display panel DP in a process for bonding the flexible circuit board CF and the display panel DP.

The dummy pads DMP may include a first dummy pad DMP1 disposed adjacent to the substrate pads LD and a second dummy pad DMP2 overlapping the alignment mark ALM in the first direction DR1. The second dummy pad DMP2 may be spaced apart from the alignment mark ALM in the first direction DR1. The second dummy pad DMP2 may be spaced apart from the alignment mark ALM and disposed in upper and lower portions of the alignment mark ALM, respectively.

The dummy pads DMP and the substrate pads LD may be extended in a diagonal direction DR-D intersecting the first direction DR1. The diagonal direction DR-D in which the dummy pads DMP and the substrate pads LD may be extended may be a direction between the first direction DR1 and the second direction DR2. For example, the extension direction of each of the dummy pads DMP and the substrate pads LD may be a direction inclined at a predetermined angle between the first direction DR1 and the second direction DR2.

The first dummy pad DMP1 may be disposed in parallel to the substrate pads LD and may have substantially the same shape as the substrate pads LD. For example, a first length h1 of the substrate pads LD extended in the diagonal direction DR-D may be substantially the same as a second length h2 of the first dummy pad DMP1 extended in the diagonal direction DR-D. In the disclosure, the phrase "substantially the same" means not only that the length, width, and the like of each component are completely the same but also that the length, width, and the like of each component are the same in a range including a difference which may be caused by a process error despite the same design. For example, a first width W1 of the substrate pads LD in the second direction DR2 and a second width W2 of the first dummy pad DMP1 in the second direction DR2 may be substantially the same. A first interval s1 between the respective substrate pads LD and a second interval s2 between the respective first dummy pads DMP1 may also be substantially the same.

Although not illustrated, a signal line may be electrically connected to the first dummy pad DMP1. The first dummy pad DMP1 may be disposed in parallel to the substrate pads LD and have substantially the same shape as the same, a signal line may be electrically connected to the first dummy pad DMP1, and a circuit for testing the resistance of pads, or a circuit for determining whether the display panel DP or the flexible circuit board CF is cracked may be electrically connected to the signal line.

At least some or a portion of the dummy pads DMP may be formed in the same process as that for forming the substrate pads LD. For example, at least some or a portion of the dummy pads DMP may include the same or similar material as the substrate pads LD and may be formed by being patterned in a process for patterning the substrate pads LD. The first dummy pad DMP1 of the dummy pads DMP may be formed by being patterned in a process for patterning the substrate pads LD.

The flexible circuit board CF may include an additional pad ALD. The additional pad ALD may be extended in the first direction DR1 and may be adjacent to an end of the flexible circuit board CF. The additional pad ALD may be spaced apart from the alignment mark ALM and the dummy pads DMP in the second direction DR2. The additional pad ALD may be adjacent to an end of the flexible printed circuit board FPC. The additional pad ALD may be disposed, in the substrate pad area PA-CF, on the outermost periphery thereof in the second direction DR2.

Referring to FIGS. 4 and 6 to 8, the display panel DP according to an embodiment may include display pads SD. The display pads SD may be disposed on the base substrate BL of the display panel DP. The display pads SD may be disposed in the pad area PA of the display panel DP.

The display pads SD may have a shape corresponding to that of the substrate pads LD included in the flexible circuit board CF. The display pads SD may be extended in the diagonal direction DR-D intersecting the first direction DR1. The diagonal direction DR-D may be a direction between the first direction DR1 and the second direction DR2. For example, the extension direction of the display pads SD may be the same as that of the substrate pads LD. Although not illustrated, the data lines DL (see FIG. 4) or the control signal lines CSL (see FIG. 4) may be electrically connected to the display pads SD.

The display panel DP may include a panel alignment mark ALM-P. The panel alignment mark ALM-P may be disposed in the pad area PA of the display panel DP. At least a portion of the panel alignment mark ALM-P may be extended in the first direction DR1 or the second direction DR2. As illustrated in FIG. 8, the panel alignment mark ALM-P may have a "T" shape in a plan view. Although not illustrated, the panel alignment mark ALM-P may be extended from at least some or a portion of the substrate pads LD. The panel alignment mark ALM-P may be used as an identification mark for identifying the position of the display panel DP or for aligning the display panel DP and the flexible circuit board CF in a process for bonding the flexible circuit board CF and the display panel DP.

The display panel DP may include an additional panel pad ALD-P. The additional panel pad ALD-P may be disposed in the pad area PA of the display panel DP. The additional panel pad ALD-P may have a shape corresponding to that of the additional pad ALD included in the flexible circuit board CF and may be disposed at a position corresponding to that of the additional pad ALD. The additional panel pad ALD-P may be spaced apart from the display pads SD and the panel alignment mark ALM-P in the second direction DR2.

Referring to FIGS. 4 and 6 to 9, in a cross-section on which the display panel DP according to an embodiment and the flexible circuit board CF are coupled or connected by the conductive adhesive film ACF, the display pads SD included in the display panel DP and the substrate pads LD included in the flexible circuit board CF may be disposed at corresponding positions. The conductive balls CB may be interposed between the display pads SD and the substrate pads LD to electrically connect the display pads SD and the substrate pads LD.

The panel alignment mark ALM-P included in the display panel DP according to an embodiment and the alignment mark ALM included in the flexible circuit board CF may be disposed at positions at which at least portions thereof correspond in the cross-section in which the display panel DP and the flexible circuit board CF are coupled or connected. For example, at least portions of the panel alignment mark ALM-P and the alignment mark ALM may overlap each other in a plan view. As the panel alignment mark ALM-P and the alignment mark ALM overlap each other in a plan view, the display panel DP and the flexible circuit board CF may be aligned in a case that the flexible circuit board CF and the display panel DP are bonded.

In the cross-section in which the display panel DP and the flexible circuit board CF are coupled or connected, the additional panel pad ALD-P included in the display panel DP and the additional pad ALD included in the flexible circuit board CF may be disposed at corresponding positions. The conductive balls CB may be interposed between the additional panel pad ALD-P and the additional pad ALD to electrically connect the additional panel pad ALD-P and the additional pad ALD. Although not illustrated, the additional panel pad ALD-P may have a sensing line or the like electrically connected thereto, the sensing line may sense cracks or the like generated at an outer periphery portion of the display panel DP. The additional pad ALD may have a sensing circuit or the like electrically connected thereto, and the sensing circuit may determine whether the display panel DP is cracked. Since the additional panel pad ALD-P and the additional pad ALD are electrically connected, whether the display panel DP is cracked may be determined.

The display pads SD and the additional panel pad ALD-P included in the display panel DP may have substantially the same width. The display pads SD and the additional panel pad ALD-P may be formed through the same process. For example, the display pads SD and the additional panel pad ALD-P may include the same metal and may be formed by patterning the additional panel pad ALD-P in a process for patterning the display pads SD.

The substrate pads LD, the dummy pads DMP, and the additional pad ALD included in the flexible circuit board CF may have substantially the same thickness. The substrate pads LD and the first dummy pad DMP1 included in the flexible circuit board CF may have substantially the same thickness. The substrate pads LD, the dummy pads DMP, and the additional pad ALD may be formed through the same process. For example, the substrate pads LD, the dummy pads DMP, and the additional pad ALD may include the same metal and may be formed by patterning the dummy pads DMP and the additional pad ALD in a process for patterning the substrate pads LD.

The panel alignment mark ALM-P and the alignment mark ALM may have a reduced thickness compared to the pads included in the display panel DP and the flexible circuit board CF. The panel alignment mark ALM-P and the alignment mark ALM may have only the minimum thickness required for alignment of the display panel DP and the flexible circuit board CF in a case that the display panel DP and the flexible circuit board CF are bonded, and may not substantially protrude. However, the panel alignment mark ALM-P and the alignment mark ALM are not limited thereto. The panel alignment mark ALM-P and the alignment mark ALM may have the same thickness as the pads included in the display panel DP and the flexible circuit board CF.

In the cross-section in the display panel DP and the flexible circuit board CF are coupled or connected, at least some or a portion of the dummy pads DMP included in the flexible circuit board CF may be disposed at a position at which the panel alignment mark ALM-P may be disposed. For example, the panel alignment mark ALM-P and at least some or a portion of the dummy pads DMP may overlap each other in a plan view. The panel alignment mark ALM-P and at least a portion of the first dummy pad DMP1 may overlap in a plan view.

In a flexible circuit board included in a display device according to an embodiment, substrate pads and a dummy pad arranged or disposed in parallel to the substrate pads may be disposed in a substrate pad area, and at least a portion of the dummy pad may have substantially the same shape as the substrate pads in a plan view. By way of example, the dummy pad may include a first dummy pad adjacent to the substrate pads, and the first dummy pad may have the same width and extension length as the substrate pads. In a flexible circuit board according to an embodiment, a dummy pad may be disposed, and thus a display panel and a flexible circuit board may be prevented from being bent or cracked at a position at which a panel alignment mark of a display panel may be disposed during a process for bonding the flexible circuit board and the display panel.

By way of example, different from the display device according to an embodiment, in a case that a dummy pad arranged or disposed in parallel to substrate pads is not included in a flexible circuit board, a flexible base substrate of a display panel or a flexible printed circuit board of the flexible circuit board may be deformed at a position at which a panel alignment mark of the display panel is disposed during a process for bonding the flexible circuit board and the display panel. After the bonding process, a problem may occur in which layers included in the display panel and the flexible circuit board are lifted by the restoring force of the base substrate or the flexible printed circuit board. However, in the display device according to an embodiment, a dummy pad overlapping a position at which a panel alignment mark of a display panel and having a predetermined thickness is disposed, and thus the display panel is disposed and a flexible circuit board may be prevented from being deformed in a process for bonding the flexible circuit board and the display panel, thereby preventing lifting of layers, and increasing the durability of the display device.

For example, in the display device according to an embodiment, at least a portion of a dummy pad may have substantially the same shape as substrate pads in a plan view, and thus, in addition to the function in which the dummy pad compensates for the step difference at a position at which an alignment mark is placed, the dummy pad may function as a pad for connecting a circuit for determining whether a defect occurs in a pad or a base layer included in the display panel and the flexible circuit board. Accordingly, a separate space for the pad to which the circuit may be electrically connected may not be required, and the reliability of the display device may be increased.

Figure 10:
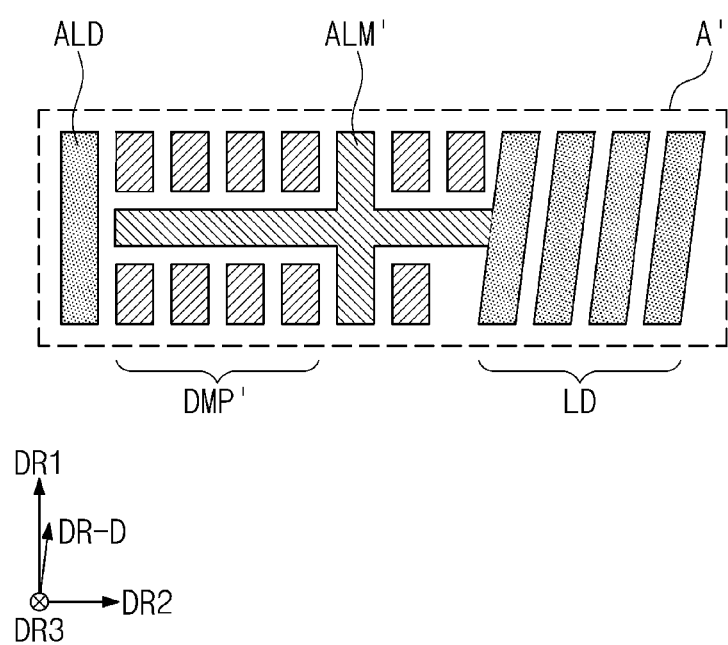
FIG. 10 is a plan view illustrating some enlarged areas of a flexible circuit board according to an embodiment.

FIG. 10 is a plan view illustrating some enlarged areas of a flexible circuit board according to an embodiment. FIG. 10 illustrates an embodiment of pads of a flexible circuit board in area A illustrated in FIG. 6. Hereinafter, in describing the pads of the flexible circuit board according to an embodiment, the same reference numerals are used to indicate the components described above, and detailed descriptions thereof are omitted.

Referring to FIGS. 4 and 6 to 10, the flexible circuit board CF according to an embodiment may include an alignment mark ALM' for example of area A', and the alignment mark ALM' may have a shape extended in the first direction DR1 and the second direction DR2. As illustrated in FIG. 10, the alignment mark ALM' may be a cruciform shape in a plan view. In a case that the flexible circuit board CF and the display panel DP are bonded, the alignment mark ALM' and the panel alignment mark ALM-P may partially overlap each other in a plan view. By way of example, a portion of the alignment mark ALM' extended in the first direction DR1 may overlap that of the panel alignment mark ALM-P extended in the first direction DR1, and a portion of the alignment mark ALM' extended in the second direction DR2 may overlap that of the panel alignment mark ALM-P extended in the second direction DR2.

The flexible circuit board CF according to an embodiment may include a dummy pad DMP', and the dummy pad DMP' may be extended in the first direction DR1. The dummy pad DMP' may be provided in a plurality, and the dummy pads DMP' may be disposed above and below the portion of the alignment mark ALM' extended in the second direction DR2. The dummy pads DMP' may be spaced apart in the first direction DR1 and the second direction DR2 above and below the portion of the alignment mark ALM' extended in the second direction DR2. The dummy pads DMP' may be arranged or disposed in parallel to the portions of the additional pad ALD and the alignment mark ALM' extended in the first direction DR1.

A signal line may be electrically connected to the dummy pads DMP'. The dummy pads DMP' may be disposed in parallel to the portions of the additional pad ALD and the alignment mark ALM' extended in the first direction DR1 and may have a signal line electrically connected thereto. A circuit for testing the resistance of pads, or a circuit for determining whether the display panel DP or the flexible circuit board CF is cracked may be electrically connected to the signal line.

At least some or a portion of the dummy pads DMP' may be formed in the same process as that for forming the additional pad ALD. For example, at least some or a portion of the dummy pads DMP' may include the same or similar material as the additional pad ALD and may be formed by being patterned in a process for patterning the additional pad ALD.

Figure 11:
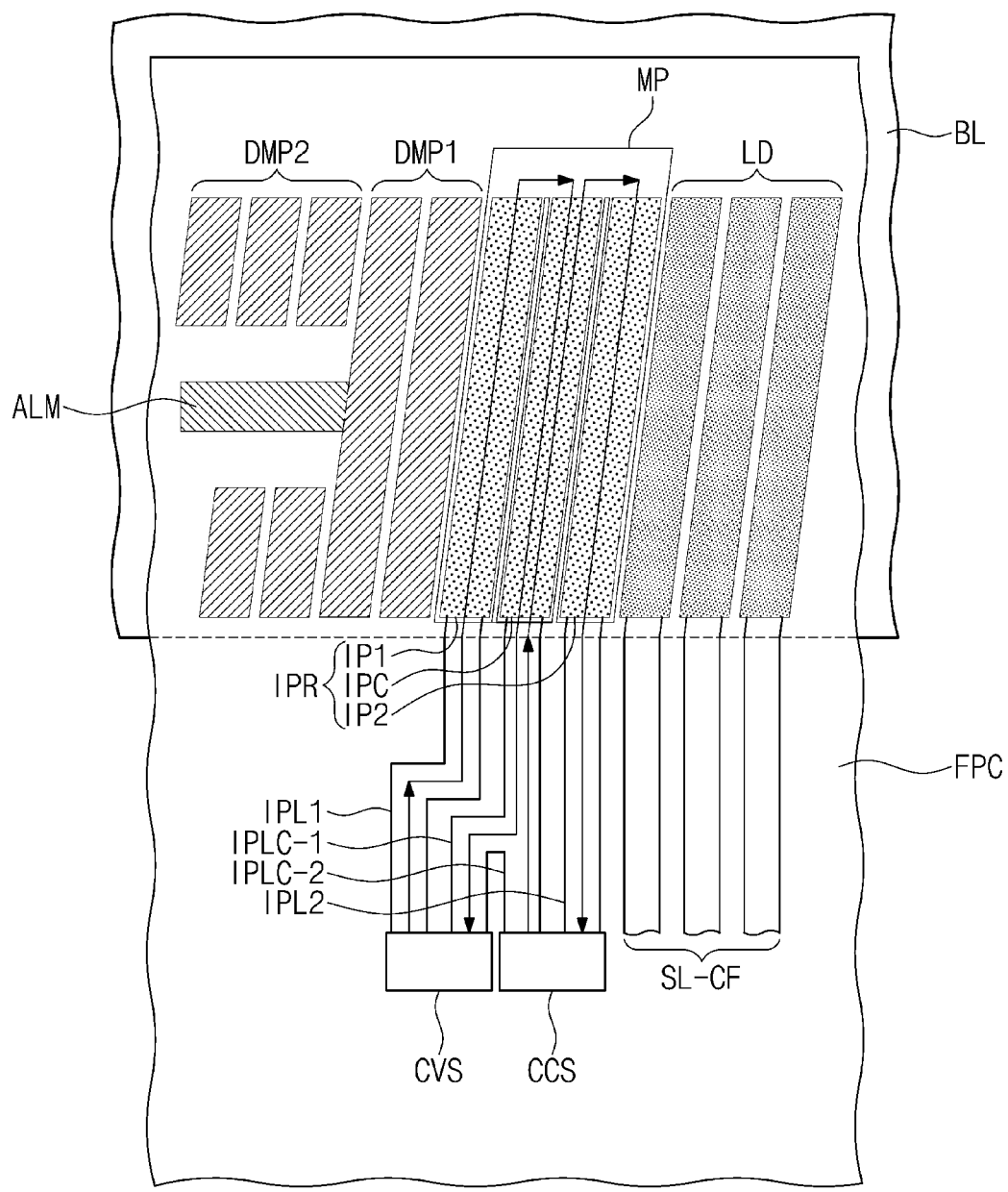
FIG. 11 and FIG. 12 are plan views of an area of a display device according to an embodiment.
Figure 12:
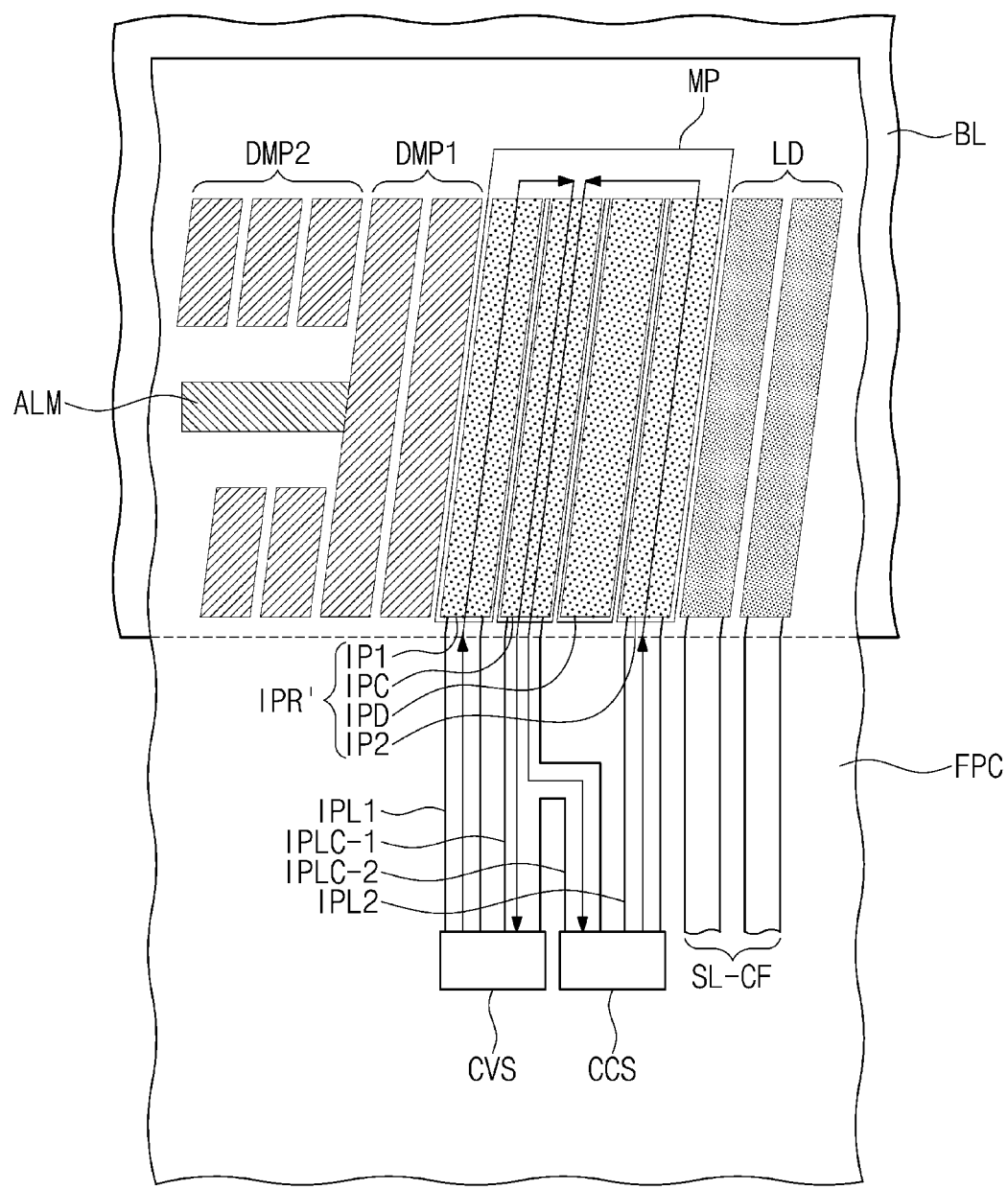

FIGS. 11 and 12 are plan views of an area of a display device according to an embodiment. In the display device according to an embodiment, FIGS. 11 and 12 illustrate some enlarged areas of a portion in which a display panel and a flexible circuit board are bonded. Hereinafter, in describing some areas of the portion in which the display panel and the flexible circuit board according to an embodiment are bonded, the same reference numerals are used to indicate the components described above, and detailed descriptions thereof are omitted.

Referring to FIGS. 4, 6, and 11, the flexible circuit board CF according to an embodiment may include resistance test pads IPR disposed between the dummy pads DMP and the substrate pads LD. The resistance test pads IPR may be disposed in parallel to the dummy pads DMP and the substrate pads LD. The resistance test pad IPR may be extended between the first dummy pad DMP1 and the substrate pads LD in a direction parallel to the extension direction of the first dummy pad DMP1 and the substrate pads LD and may be disposed in parallel to the first dummy pad DMP1 and the substrate pads LD.

The resistance test pads IPR may be electrically connected to a constant current source CCS and a constant voltage source CVS. The constant current source CCS may be a device which provides power of a constant current to the resistance test pads IPR, and the constant voltage source CVS may be a device which provides power of a constant voltage to the resistance test pads IPR.

The resistance test pads IPR may include a first test pad IP1, a common test pad IPC, and a second test pad IP2 which may be sequentially arranged or disposed in the second direction DR2. The first test pad IP1 may be electrically connected to the constant voltage source CVS through a first substrate line IPL1, and the second test pad IP2 may be electrically connected to the constant current source CCS through a second substrate line IPL2. The common test pad IPC may be electrically connected to the constant voltage source CVS through a first common substrate line IPLC-1 and may be electrically connected to the constant current source CCS through a second common substrate line IPLC-2.

In the flexible circuit board CF according to an embodiment, some or a portion of the dummy pads DMP may be any one of the resistance test pads IPR. In an embodiment, some or a portion of the first dummy pads DMP1 may function as any one of the resistance test pads IPR. For example, some or a portion of the first dummy pads DMP1 adjacent to the substrate pads LD may function as any one of the resistance test pads IPR. In an embodiment, some or a portion of the first dummy pads DMP1 may function as the first test pad IP1 or the second test pad IP2.

The resistance test pads IPR may be electrically connected to a measurement pad MP disposed on the base substrate BL of the display panel DP. Although not illustrated, the measurement pad MP may be electrically connected to the resistance test pads IPR by the conductive adhesive film ACF. The measurement pad MP may include access portions having a shape corresponding to the resistance test pads IPR and may include a connection portion for electrically connecting each of the access portions disposed at an upper portion of the access portion. In an embodiment, the measurement pad MP may include three access portions corresponding to the first test pad IP1, the common test pad IPC, and the second test pad IP2, and the three access portions may be electrically connected by connection portions disposed at upper portions of the three access portions.

The flexible circuit board CF according to an embodiment may include the resistance test pads IPR, and the resistance test pads IPR may be electrically connected to the constant current source CCS and the constant voltage source CVS. As an example, among the resistance test pads IPR, a constant current and a constant voltage may be simultaneously provided only to the common test pad IPC through the constant current source CCS and the constant voltage source CVS, and either a constant current or a constant voltage may be provided to each of the first test pad IP1 and the second test pad IP2 disposed on both sides. Accordingly, in the flexible circuit board CF according to an embodiment, the contact resistance between the common test pad IPC among the resistance test pads IPR and an access portion of the measurement pad MP corresponding thereto may be measured. For example, the contact resistance between a single test pad and a single measurement pad may be measured without noise caused by the resistance of a line. Accordingly, the resistance of a press portion between the display panel DP and the flexible circuit board CF may be measured, and whether the press portion is lifted may be measured, thereby increasing the reliability of the display device.

Referring to FIGS. 4, 6, 11, and 12, resistance test pads IPR' according to an embodiment may further include a dummy test pad IPD disposed between the first test pad IP1 and the second test pad IP2. The dummy test pad IPD may be arranged or disposed in parallel to the first test pad IP1, the common test pad IPC, and the second test pad IP2.

The constant current source CCS and the constant voltage source CVS may not be electrically connected to the dummy test pad IPD. In the flexible circuit board CF according to an embodiment, the resistance test pads IPR' may include the dummy test pad IPD not electrically connected to each of the constant current source CCS and the constant voltage source CVS, and thus a space may be secured in which common substrate lines may be disposed such that the common test pad IPC may be electrically connected to the constant voltage source CVS through the first common substrate line IPLC-1 and to the constant current source CCS through the second common substrate line IPLC-2.

According to an embodiment, the durability and reliability of a display device may be increased by including dummy patterns arranged or disposed in parallel to substrate pads of a flexible circuit board and having the same shape as the substrate pads, thereby preventing problems such as bending or layer lifting from occurring in a flexible circuit board and a display panel during a process for bonding the flexible circuit board and the display panel.

Although the disclosure has been described with reference to embodiments, it will be understood by those skilled in the art that various changes in form and details may be made therein without departing from the spirit and scope of the disclosure as set forth in the following claims. Accordingly, the technical scope of the disclosure is not intended to be limited to the contents set forth in the detailed description of the specification, but is intended to be defined by the appended claims.

What is claimed is:

1. A display device comprising:
   a display panel including a plurality of display pads, a portion of the plurality of the display pads being extended along a first direction and arranged along a second direction intersecting the first direction; and
   a flexible circuit board including:
      a plurality of substrate pads electrically connected to the plurality of display pads; and
      a plurality of dummy pads spaced apart from the plurality of substrate pads and arranged in parallel to the plurality of substrate pads along the second direction, wherein
   a portion of the plurality of dummy pads have an extension length in the first direction and a width in the second direction substantially same as an extension length in the first direction and a width in the second direction, respectively, of the plurality of substrate pads, the portion of the plurality of dummy pads and the plurality of substrate pads having substantially a same shape, and
   the display panel further comprises a panel alignment mark at least partially overlapping a portion of each of the dummy pads in a thickness direction.

2. The display device of claim 1, wherein each of the plurality of substrate pads and the plurality of dummy pads is extended in a diagonal direction between the first direction and the second direction.

3. The display device of claim 2, wherein a length of each of the plurality of substrate pads extended in the diagonal direction and a length of each of the plurality of dummy pads extended in the diagonal direction are substantially same.

4. The display device of claim 1, wherein the flexible circuit board further comprises an alignment mark overlapping a portion of the plurality of dummy pads in the first direction.

5. The display device of claim 4, wherein
   the alignment mark is extended along the second direction; and
   the plurality of dummy pads comprises:
      a first dummy pad disposed adjacent to the plurality of substrate pads; and
      a second dummy pad overlapping the alignment mark in the first direction.

6. The display device of claim 4, wherein
   the plurality of display pads overlap the plurality of substrate pads in a plan view; and
   the panel alignment mark at least partially overlaps the alignment mark in a plan view.

7. The display device of claim 1, wherein the flexible circuit board further comprises a plurality of resistance test pads disposed between the plurality of substrate pads and the plurality of dummy pads.

8. The display device of claim 7, wherein the plurality of resistance test pads comprise:
   a first test pad electrically connected to a constant current source;
   a second test pad electrically connected to a constant voltage source; and
   a common test pad electrically connected to the constant current source and the constant voltage source.

9. The display device of claim 8, wherein
   the common test pad is disposed between the first test pad and the second test pad; and
   the plurality of resistance test pads further comprise a dummy test pad disposed between the first test pad and the second test pad.

10. The display device of claim 8, wherein a portion of the plurality of dummy pads are the first test pad or the second test pad.

11. The display device of claim 8, wherein the display panel further comprises a measurement pad electrically connected to the first test pad, the second test pad, and the common test pad.

12. The display device of claim 1, further comprising:
   a conductive adhesive film disposed between the display panel and the flexible circuit board and electrically connecting the plurality of display pads to the plurality of substrate pads.

13. The display device of claim 1, wherein the flexible circuit board further comprises an additional pad extended along the first direction and disposed adjacent to an end of the flexible circuit board.

14. The display device of claim 1, further comprising:
   a main circuit board electrically connected to the flexible circuit board.

15. The display device of claim 1, wherein the dummy pads prevent one or more of a bending or a breakage of the display panel at the alignment mark.

16. A display device comprising:
   a display panel including a plurality of display pads, a portion of the plurality of display pads being extended along a first direction and arranged along a second direction intersecting the first direction; and
   a flexible circuit board including:
      a plurality of substrate pads electrically connected to the plurality of display pads;
      a plurality of dummy pads spaced apart from the plurality of substrate pads and arranged in parallel to the plurality of substrate pads along the second direction; and
      a plurality of resistance test pads disposed between the plurality of substrate pads and the plurality of dummy pads,
   wherein the plurality of resistance test pads comprise:
      a first test pad electrically connected to a constant current source;
      a second test pad electrically connected to a constant voltage source; and a common test pad electrically connected to the constant current source and the constant voltage source.

17. The display device of claim 16, wherein a portion of the plurality of dummy pads are the first test pad or the second test pad.

18. The display device of claim 16, wherein
the common test pad is disposed between the first test pad and the second test pad; and
the plurality of resistance test pads further comprise a dummy test pad disposed between the first test pad and the second test pad.

19. The display device of claim 16, wherein each of the plurality of substrate pads, the plurality of resistance test pads, and the plurality of dummy pads is inclined at an angle between the first direction and the second direction.

20. The display device of claim 16, wherein
the flexible circuit board further comprises an alignment mark overlapping at least a portion of the plurality of dummy pads in the first direction; and
the display panel further comprises a panel alignment mark at least partially overlapping the alignment mark in a plan view.

21. A display device comprising:
a display panel including a plurality of display pads extended along a first direction and arranged along a second direction intersecting the first direction; and
a flexible circuit board including:
a plurality of substrate pads electrically connected to the plurality of display pads; and
a plurality of resistance test pads arranged in parallel to the plurality of substrate pads along the second direction,
wherein the plurality of resistance test pads include:
a first test pad electrically connected to a constant current source;
a second test pad electrically connected to a constant voltage source;
a common test pad electrically connected to the constant current source and the constant voltage source; and
a dummy test pad disposed between the first test pad and the second test pad, wherein the common test pad is disposed between the first test pad and the second test pad.

* * * * *